United States Patent
Ewen et al.

(10) Patent No.: US 6,297,685 B1
(45) Date of Patent: Oct. 2, 2001

(54) HIGH-SPEED FULLY-COMPENSATED LOW-VOLTAGE DIFFERENTIAL DRIVER/TRANSLATOR CIRCUIT ARRANGEMENT

(75) Inventors: John Farley Ewen; Stephen Charles Wilkinson-Gruber, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/593,997

(22) Filed: Jun. 14, 2000

(51) Int. Cl.[7] .................................................. H03K 3/42
(52) U.S. Cl. .............................................. 327/513; 327/378
(58) Field of Search .................................. 327/513, 560, 327/561, 562, 563, 378; 330/252, 256, 261, 289, 254, 266, 272

(56) References Cited

U.S. PATENT DOCUMENTS

| | | | |
|---|---|---|---|
| 5,072,136 | 12/1991 | Naghshineh | 326/126 |
| 5,717,347 | * 2/1998 | Dufour | 326/127 |
| 5,767,538 | 6/1998 | Mullins et al. | 257/115 |
| 5,793,194 | * 8/1998 | Lewis | 323/312 |
| 5,861,771 | * 1/1999 | Matsuda et al. | 327/540 |
| 5,933,265 | 8/1999 | Nagarajan | 359/189 |
| 6,008,667 | 12/1999 | Fahrenbruch | 326/66 |
| 6,023,192 | * 2/2000 | Didier | 330/254 |
| 6,057,716 | * 5/2000 | Dinteman et al. | 327/108 |

OTHER PUBLICATIONS

Gabara, Thaddeus et al., LVDS I/O Buffers with a Controlled Reference Circuit, IEEE Publication No. 1063–0988/97, (1997), pp. 311–315.

* cited by examiner

Primary Examiner—Tuan T. Lam
Assistant Examiner—Hiep Nguyen
(74) Attorney, Agent, or Firm—Wood, Herron & Evans (57) ABSTRACT

An output buffer provides a stable, predetermined low voltage differential over power supply, temperature, and process variations yet has a high speed of operation. More particularly, a data path of an output buffer includes an emitter-coupled differential amplifier followed by an output section of two level-shifting emitter followers. A predetermined operating current biases the differential amplifier for unsaturated operation and a reference current biases the output section for unsaturated operation. The data path remains unencumbered by compensation circuitry to preserve high speed operation. Instead, a voltage compensator biases the differential amplifier to compensate, at least in part, for variations in a supply voltage. In addition, a variable biasing current to the voltage compensator with a predetermined temperature coefficient may further temperature compensate the differential amplifier. In addition to such "upstream" compensation, the output buffer may further include "downstream" temperature compensation by the addition of a $V_{BE}$ multiplier circuit to the reference current biasing of the output section. Additional temperature and level-shifting compensation may also be achieved through cascading a plurality of buffer stages.

14 Claims, 6 Drawing Sheets

HIGH-SPEED FULLY-COMPENSATED LOW-VOLTAGE DIFFERENTIAL DRIVER/TRANSLATOR CIRCUIT ARRANGEMENT

FIELD OF THE INVENTION

The invention is generally related to output buffer circuit arrangements, and more particularly, to low voltage differential output buffer circuit arrangements.

BACKGROUND OF THE INVENTION

As the performance of integrated circuits continues to increase, the data transfer rates between packaged devices on a circuit board or between different circuit boards often has a comparatively greater impact on system performance, requiring improvements to data transmission paths and the input/output (I/O) circuits that transfer information across the paths.

I/O circuits often include, or are comprised entirely of, one or more output buffers that each drive an input signal output by a transmitting device across a data transmission path to a receiving device. Output buffers typically receive an input signal in one format that is compatible with the transmitting device and output a corresponding output signal in a format that is compatible with the data transmission path. Another function of an output buffer is to effectively isolate, or buffer, the transmitting device from the data transmission path.

One type of output buffer used for digital data transfer is a single-ended output buffer, which converts an input signal to a digital output signal referenced to ground. Often, the input signal is a single input also referenced to ground.

As an alternate to single-ended output buffers, differential output buffers are used to drive a balanced output signal across a pair of interconnects to a receiving device, providing several advantages over single-ended output buffers. For instance, differential output buffers reduce noise by eliminating "ground bounce". Differential output buffers also dissipate only a fraction of the power of single-ended data transfer output buffers.

Conventional differential output buffers suffer from dependencies on supply voltages, operating temperatures, and process variations during manufacture that cause output signal variations. In some applications, these dependencies limit the operating environment and implementation in order to produce an output signal that may be accurately received across the data transmission path. In particular, these dependencies cause variations in an output common-mode voltage ("common mode") of a differential output buffer. Thus, a voltage bias to each interconnect of the output buffer may vary over time with respect to the ground reference.

Countering the dependencies in conventional output buffers results in a number of limitations. For example, complex external heating and cooling equipment may be employed to maintain the operating temperature within a narrow range. As another example, more complex power supplies may be required to maintain a supply voltage within a narrow range.

It is also generally known to include compensation circuitry in an output buffer to reduce variations in the output signal. In addition to disadvantages associated with the added complexity, such compensation circuitry often introduces additional delays and data rate limitations on an output buffer that prevent higher data rates for high-speed communication systems.

Consequently, there exists a significant need for a differential output buffer that accurately produces an output signal for high-speed communication systems with increased tolerance for variations in supply voltage, operating temperature and process variations.

In addition to buffering for the power requirements and variations in data transmission systems, output buffers are often required to drive signals across data transmission paths between different transistor technologies.

For example, for low and medium operating frequencies, CMOS (Complementary Metal Oxide Semiconductor) integrated circuits are widely used due to a relatively small size and low power consumption as compared to other transistor technologies. At high operating frequencies, Emitter Coupled Logic (ECL) is typically used since power consumption of ECL is independent of operating frequency, whereas CMOS becomes relatively noisy and consumes significantly more power at higher frequencies, or is simply not fast enough.

Output buffers are often required to translate the differing voltage levels used in the different transistor technologies. Specifically, ECL typically operates at higher voltage levels than does CMOS. Thus, a low voltage differential output buffer is required to translate (level-shift) the high and low logic voltage levels of an input signal from an ECL transmitting device to a CMOS receiving device.

Optical communication systems are an example of an application for ECL-to-CMOS translators. Fiber optic transmission lines allow high-speed data rates. An optical receiver converts the optical pulses from the fiber optic transmission line into electrical pulses with a series of ECL devices capable of operating at the high data rates. Once converted to an input signal, the optical receiver acts as a transmitting device, passing the input signal to a digital CMOS protocol chip as a receiving device for further processing. An output buffer is used between the ECL transmitting and CMOS receiving devices.

A low voltage differential output buffer for level shifting between ECL and CMOS is often accomplished with emitter follower circuits downstream of a differential amplifier. However, emitter follower circuits typically have a temperature dependency that further impacts the performance of the output buffer.

Since it is often impractical or undesirable to maintain the operating environment of the output buffer, variations in the common mode of an output signal to a receiving device often necessitates encoding the data in the input signal. An encoded signal has an average value of zero, with as many high logic levels as low logic levels. Consequently, the data itself does not introduce a varying common mode to the output signal that would further complicate reception of an output signal containing variations due to temperature and supply voltage. However, the additional complexity of encoding may be impractical or undesirable for many applications. In addition, the encoded data in the output signal only avoids compounding the problem rather than solving it.

It also known to mitigate variations due to temperature and supply voltage with an output buffer biased by a plurality of negative power supplies providing multiple voltage levels. Moreover, these known output buffers generate output voltage levels over 3 V. Consequently, these known output buffers are inappropriate for noninverted single power supply applications, especially at output voltage levels under 3 V.

Increasingly, existing and anticipated receiving devices require lower voltage levels in order to achieve higher operating frequencies, for example, signals based on a upper voltage level of 1.25 V and less. These lower voltage levels generate less heat, compensating for the additional heat attributable to increased operating frequency. The smaller voltage differences also contribute to higher operating frequency by taking less time to switch between levels. Thus, the need for low voltage differential output buffers is increasing.

Consequently, a significant need exists for a low voltage differential output buffer that operates at a high data rate with increased tolerance for variations in supply voltage, operating temperature and process variations and maintains a stable output common mode voltage.

SUMMARY OF THE INVENTION

The invention addresses these and other problems associated with the prior art by providing a circuit arrangement and method of producing a differential output buffer that is suitable for use at high data rates, yet is tolerant of variations in supply voltage and operating temperature. In particular, an output buffer is implemented such that variations due to process are mitigated. Moreover, in some embodiments a low voltage differential output buffer may provide a stable level-shifted output signal that is similarly stable over variations in supply voltage and operating temperature.

Consistent with one aspect of the invention, a circuit arrangement includes a differential amplifier having a supply voltage compensated by a compensation circuit. The compensation circuit comprises a compensation transistor having a base, an emitter, and a collector that is coupled to a first supply input of the differential amplifier. A first compensation resistor is coupled between a voltage source and the collector of the compensation transistor. A second compensation resistor is coupled between the emitter of the compensation transistor and ground. A third compensation resistor is coupled between the voltage source and the base of the compensation transistor. A fourth compensation resistor is coupled between the base of the compensation transistor and ground. The resistance values of the first, second, third, and fourth compensation resistors are advantageously selected to eliminate or reduce dependence of the output voltage levels of the output buffer on the supply voltage.

Consistent with another aspect of the invention, a method is provided for compensating a data path comprised of a differential amplifier followed by an output section that includes two level-shifting emitter followers. The data path is compensated at least in part by varying a compensating voltage at the first supply input of the differential amplifier. The variation in compensated voltage mitigates or eliminates variations in an output signal due to variations in a supply voltage. The differential amplifier is biased at a second supply input with a predetermined operating current selected to maintain the differential amplifier in unsaturated operation. Also, the output section is current biased with a predetermined reference current selected to maintain the output section in unsaturated operation.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
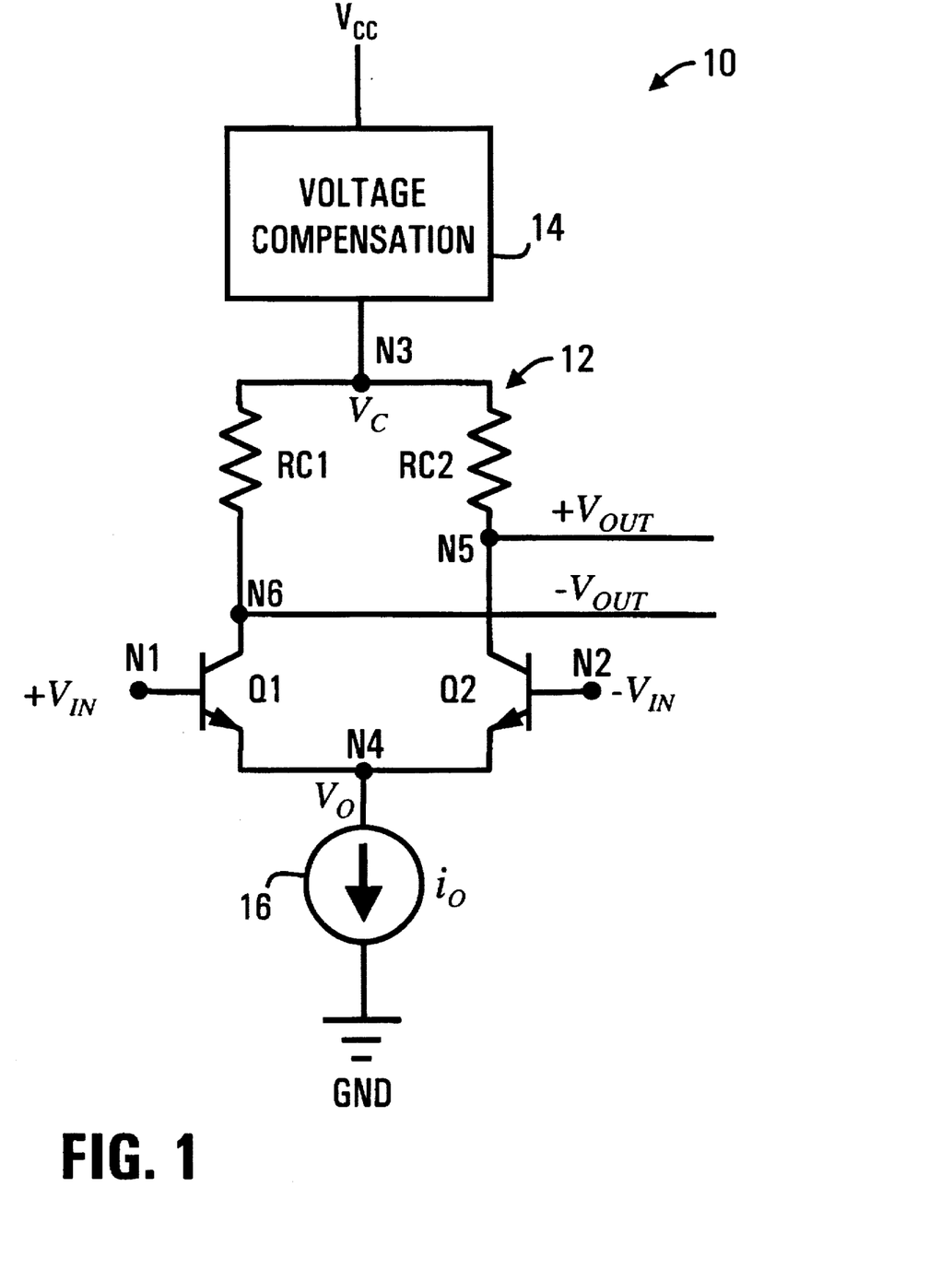
FIG. 1 is a schematic diagram of a portion of first illustrative version of an output buffer consistent with the invention.

Turning to the Drawings, wherein like numbers denote like parts throughout the several views, FIG. 1 depicts a first illustrative version of an output buffer 10 that includes a differential amplifier 12 biased by a voltage compensator 14. The voltage compensator 14 is powered by a supply voltage $V_{CC}$ from a power supply (not shown) to produce a compensated voltage $V_C$ to bias the differential amplifier 12. A current source 16 produces an operating current $i_O$ to maintain the differential amplifier 12 in an unsaturated mode of operation.

The voltage compensator 14 provides a way to lower an output common-mode voltage of the differential amplifier 12 and to compensate for variations in the supply voltage $V_{CC}$, variations in the operating temperature, and/or manufacturing process variations in the components of the output buffer 10 to stabilize the output common-mode voltage. Maintaining an accurate output common-mode voltage ("common-mode") is of particular interest in a DC-coupled data channel between a transmitting device and a receiving device (not shown) where the data pattern transmitted is not required to be encoded, scrambled, or otherwise DC balanced (i.e., average is not 0).

The differential amplifier 12 is formed from a first input transistor Q1, a second input transistor Q2, a first compensation resistor RC1, and a second compensation resistor RC2. The differential amplifier 12 is internally and externally coupled at six nodes: a first signal input node N1, a second signal input node N2, a first supply input node N3 for receiving the bias of the compensated voltage $V_C$, a second supply input node N4 having an operating voltage $V_O$, a first output signal node N5, and a second signal output node N6.

Each of the first and second input transistors Q1, Q2 include a base, collector and emitter. The base of the first input transistor Q1 is coupled to the first signal input node N1, the collector of the first input transistor Q1 is coupled to the second signal output node N6, and the emitter of the first input transistor Q1 is coupled to the second supply input node N4. The base of the second input transistor Q2 is coupled to the second signal input node N2, the collector of the second input transistor Q2 is coupled to the first output signal node N5, and the emitter of the first input transistor Q2 is coupled to the second supply input node N4. The second compensation resistor RC2 is coupled between first supply input node N3 and the first output signal node N5. The first compensation resistor RC1 is coupled between the first supply node N3 and the second signal output node N6.

The emitter-coupled differential amplifier 12 so formed produces a differential output in response to a differential input. More particularly, the positive and negative phases of a first input voltage $+V_{IN}$ at node N1 and a second input voltage $-V_{IN}$ at node N2 drive the respective bases of input signal transistors Q1, Q2. A resulting high output voltage level $V_{OH}$ equal to the compensated voltage $V_C$ is provided as a first output signal $+V_{OUT}$ at node N5 when $+V_{IN}$ is high and as a second output signal $-V_{OUT}$ at node N6 when $-V_{IN}$ is high. A resulting low output voltage level $V_{OL}$ is provided as the first output signal $+V_{OUT}$ at node N5 when $+V_{IN}$ is low and as the second output signal $-V_{OUT}$ at node N6 when $-V_{IN}$ is low.

The values of the high output voltage level $V_{OH}$ and low output voltage level $V_{OL}$ depend upon the biasing at the first and second supply input nodes N3, N4. Generally-known output buffers 10 often include only a resistive coupling R of the first supply input node N3 to the supply voltage $V_{CC}$. Consequently, the output voltage levels $V_{OH}$, $V_{OL}$ can be shown to be:

$$V_{OH(N5, N6)} = V_{CC} - i_O * R$$

$$V_{OL(N6, N5)} = V_{CC} - i_O * R_x,$$

where $$R_x = R + RC1 = R + RC2$$

Thus, the output voltage levels $V_{OH}$, $V_{OL}$ depend on the supply voltage $V_{CC}$.

Figure 2:
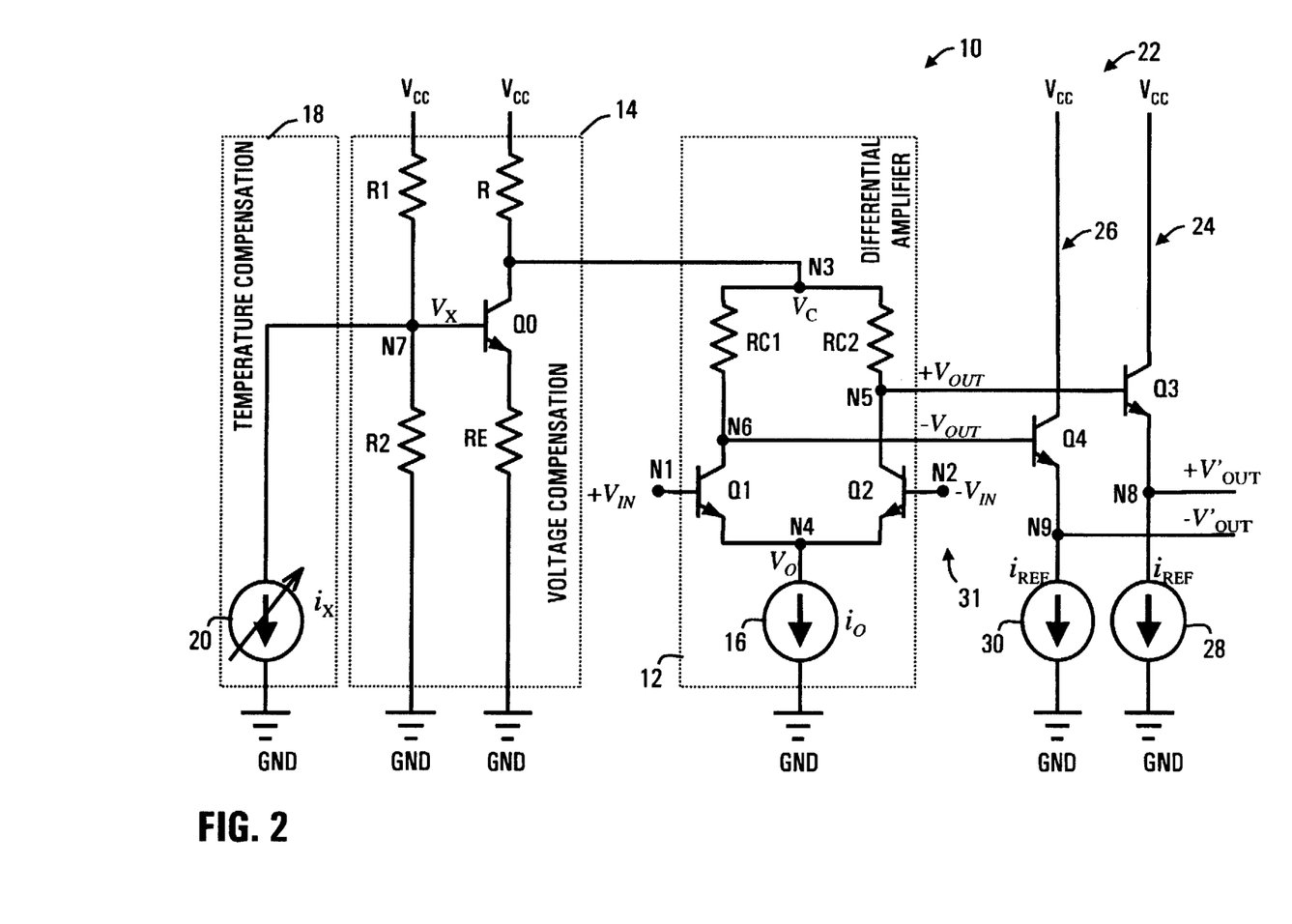
FIG. 2 is a schematic diagram of the output buffer of FIG. 1, depicting an output section and one implementation of the voltage compensator.

Referring to FIG. 2, an exemplary version of the voltage compensator 14 consistent with the invention is depicted for eliminating or reducing the dependence of the output voltage levels $V_{OH}$, $V_{OL}$ on the supply voltage $V_{CC}$. The voltage compensator 14 includes a first compensation resistor R, a second compensation resistor RE, a third compensation resistor R1, a fourth compensation resistor R2, and a compensation transistor Q0 having a base, collector and emitter. The collector of the compensation transistor Q0 is coupled to the first supply input node N3. The emitter of the compensation transistor Q0 is operatively coupled to ground via the second compensation resistor RE. The base of the compensation transistor Q0 is biased at a node N7 having a voltage $V_X$. Node N7 is coupled to the supply voltage $V_{CC}$ via the third compensation resistor R1 and is coupled to ground via the fourth compensation resistor R2. Consequently, the compensated voltage $V_C$ may be shown to be:

$$V_C = V_{CC} * (1-k) + (R/RE) * V_{BE} - R * i_O,$$

where $$k = (R/RE) * (R2/(R1+R2))$$

Therefore, values of R, RE, R1 and R2 may be selected so that k=1, and the compensated voltage $V_C$ no longer depends on the supply voltage $V_{CC}$. Generally, variations in resistance tracking over process is small. Consequently, variations due to manufacturing tolerances may be reduced with compensation circuitry designs that depend on resistance ratios. Disregarding for a moment variation of the compensating voltage due to an introduced base-emitter voltage $V_{BE}$ of compensation transistor Q0, the output voltage levels now become:

$$V_{OH(N5, N6)} = V_C$$

$$V_{OL(N6, N5)} = V_C - i_O * R_Z,$$

where $$R_Z = RC1 = RC2$$

which are likewise independent of the supply voltage $V_{CC}$. Thus, the output voltage signals $+V_{OUT}$, $-V_{OUT}$ may be provided with a reduced dependence on the supply voltage $V_{CC}$.

The voltage compensator 14 described above introduces a temperature dependent base-emitter voltage $V_{BE}$ of the compensation transistor Q0 into the determination of the compensated voltage $V_C$. Although this variation may be ignored in some applications, it is desirable to further adjust the compensating voltage $V_C$ to eliminate variations due to temperature. Consequently, a temperature compensator 18, represented as a variable current source 20, may be used to draw a positive temperature coefficient current $i_X$ from the node N7, offsetting, at least in part, the base-emitter voltage $V_{BE}$. The addition of the temperature compensator 18 changes the determination of the compensated voltage $V_C$ to the following:

$$V_C = V_{CC} * (1-k) + (R/RE) * V_{BE} + k * R1 * i_X - R * i_O$$

For k=1, this simplifies to:

$$V_C = (R/RE) * V_{BE} + R1 * i_X - R * i_O$$

The current $i_X$ is predetermined so that the temperature coefficient of the term $(R/RE) * V_{BE}$ is offset by the temperature coefficient of the term $R1 * i_X$.

The voltage compensator 14 may further mitigate supply voltage dependence of an output section 22 of the output buffer 10. A first illustrative version of an output section 22 is depicted with a first emitter follower 24 for receiving the first output voltage $+V_{OUT}$ from node N5 and producing a first level-shifted output voltage $+V'_{OUT}$ at a node N8, and a second emitter follower 26 for receiving the second output voltage $-V_{OUT}$ at node N6 and producing a second level-shifted output voltage $-V'_{OUT}$ at a node N9. The base-emitter voltage $V_{BE}$ of each emitter follower 24, 26, provides the level shift in this version of the output section 22, in conjunction with respective reference current sources 28, 30.

The differential amplifier 12 followed by the emitter followers 24, 26 forms a high speed data path 31 that may be used in applications requiring high data rates (e.g., 1.25 G-bits/sec or more). It is desirable that the data path 31 remain unencumbered by compensation and level shifting circuitry to the greatest extent possible in order to maintain the high-speed data rate.

Each of the transistors Q1–Q4 in the data path 31 may advantageously be Bipolar Junction Transistors (BJT) for high-speed, drive capability and process tolerance. Transistors Q1–Q4 in the data path 31, as well as other transistors described herein in the exemplary versions of the output buffer 10, may advantageously be n-type transistors with the inherently reduced size and increased switching speed over p-type transistors.

Figure 3:
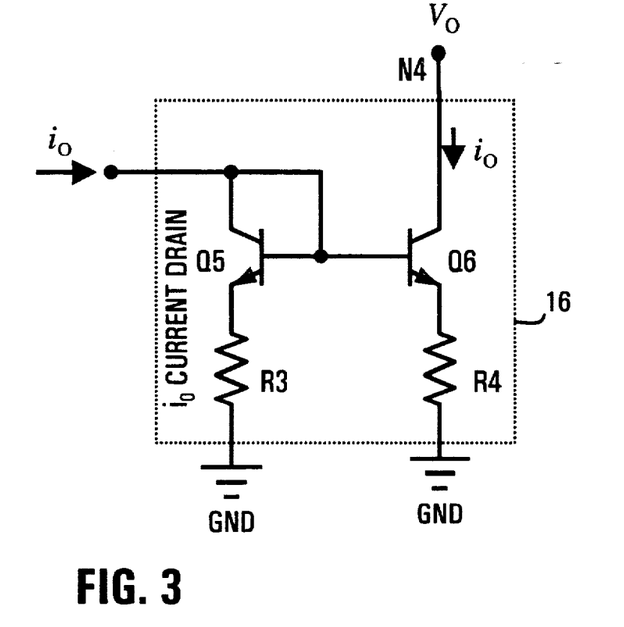
FIG. 3 is a schematic diagram of the single current source of FIGS. 1 and 2.

Referring to FIG. 3, an illustrative single current source 16 for the output buffer 10 of FIG. 2 is depicted as a current mirror formed from a resistor R3, a resistor R4, a transistor Q5, and a transistor Q6. Each transistor Q5, Q6 has a base, collector and emitter. The predetermined operating current $i_O$ is provided to the node formed by the coupled collector and base of transistor Q5. The emitter of the transistor Q5 is coupled to ground via resistor R3. The base of transistor Q5 is coupled to the base of transistor Q6. The emitter of transistor Q6 is coupled to ground via resistor R4. The collector of transistor Q6 is coupled to supply input voltage node N4, from which is mirrored the operating current $i_O$.

Figure 4:
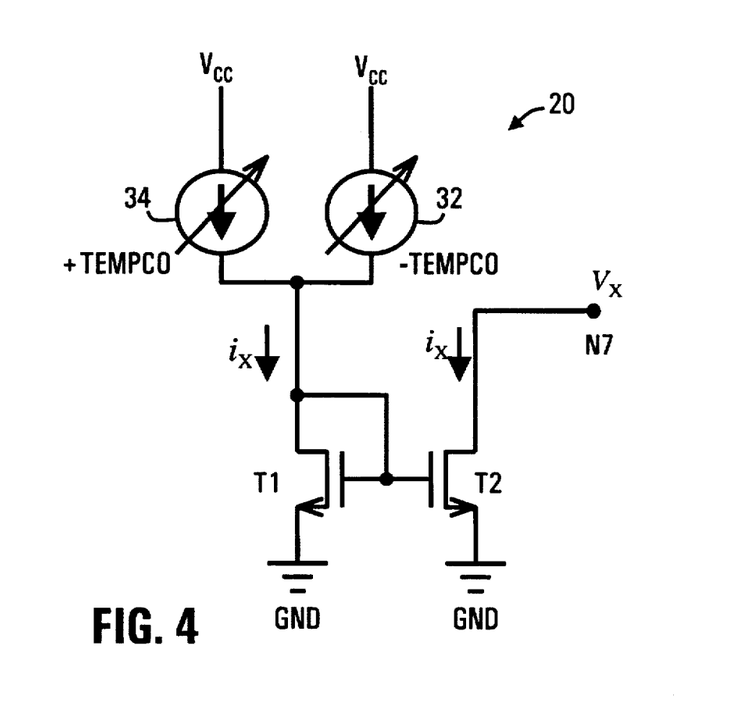
FIG. 4 is a schematic diagram of the temperature compensator of FIG. 2.

Referring to FIG. 4, a temperature compensator 18 for the output buffer 10 of FIG. 2 is depicted. The positive temperature coefficient current $i_X$ is produced by a summing the outputs from two current sources 32, 34. For example, the negative temperature coefficient ("−TEMPCO") current source 32 may be formed from a $V_{BE}$ current reference and the positive temperature coefficient ("+TEMPCO") current source 34 may be formed from a Proportional To Absolute Temperature (PTAT) current source.

The current $i_X$ is mirrored at node N7 by a first FET T1 and a second FET T2, each having a source, gate, and drain. The drain of transistor T1 is coupled to the gate of transistor T1, as well as to current sources 32, 34 to receive current $i_X$. The sources of transistors T1 and T2 are each coupled to ground. The gate of the second transistor T2 is coupled to the gate of the first transistor T1. The drain of the second transistor T2 is coupled to node N7 to source current $i_X$.

Figure 5:
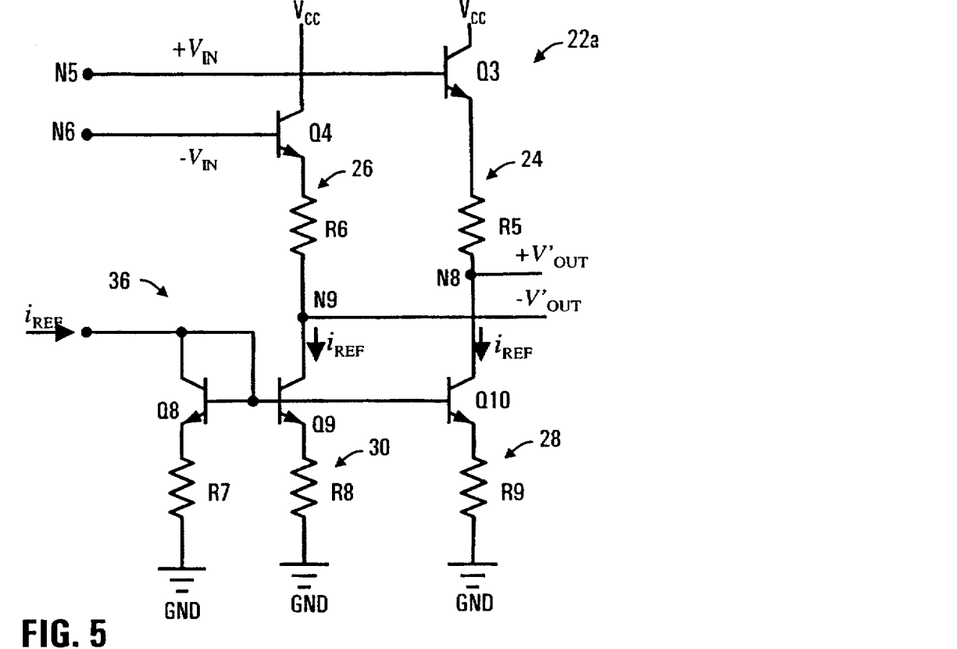
FIG. 5 is a schematic diagram of an alternate output section to that of FIG. 2.

Referring to FIG. 5, a second illustrative version of an output section 22a of the output buffer 10 of FIG. 2 depicts the use of resistors for further level shifting. In particular, a first level-shifting resistor R5 is coupled between the emitter of the first output transistor Q3 and node N8 and a second level-shifting resistor R6 is coupled between the emitter of the second output transistor Q4 and node N9. The additional level shift of resistors R5 and R6 is thus equal to their resistance times the reference current $i_{REF}$.

The emitter followers 24, 26 are biased by current sources 28, 30 in the form of a dual current mirror 36. In particular, biasing transistors Q8, Q9 and Q10 each have a base, collector and emitter. A predetermined reference current $i_{REF}$ is provided to a node formed from the coupled collector and base of transistor Q8. The emitter of transistor Q8 is coupled to ground via a resistor R7. The collector of transistor Q9 is coupled to node N9 to source a mirrored reference current $i_{REF}$. The base of the transistor Q9 is coupled to the base of transistor Q8. The emitter of the transistor Q9 is coupled to ground via a resistor R8. The collector of transistor Q10 is coupled to node N8 to source a mirrored reference current $i_{REF}$. The base of the transistor Q10 is coupled to the base of transistor Q8. The emitter of the transistor Q10 is coupled to ground via a resistor R9.

Figure 6:
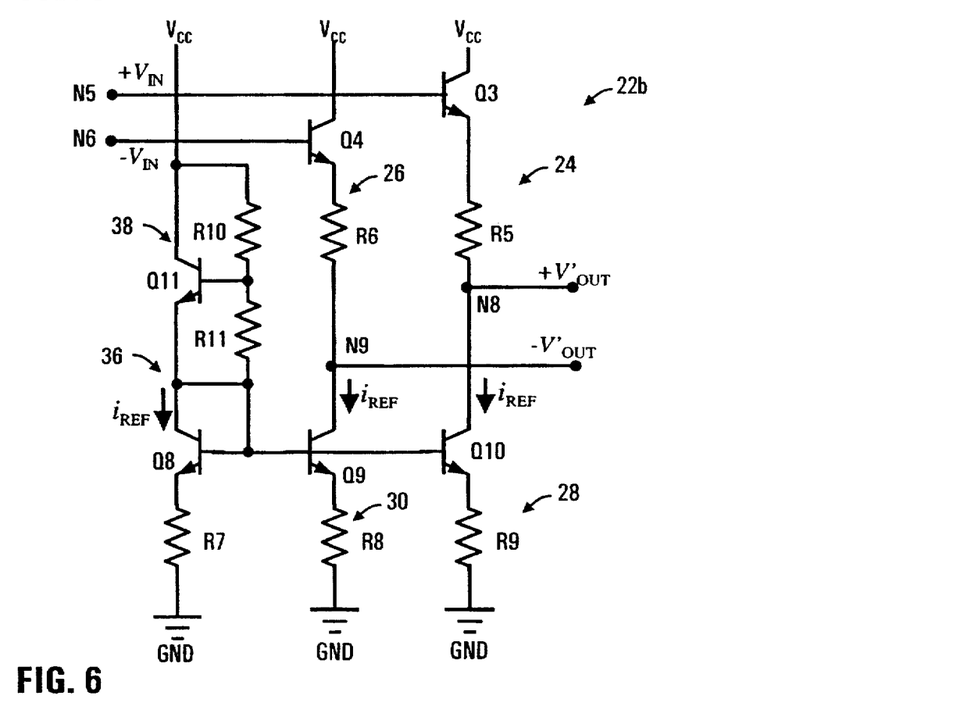
FIG. 6 is a schematic diagram of another alternate output section to that of FIG.2.

Referring to FIG. 6, a third illustrative version of an output section 22b of the output buffer 10 of FIG. 2 includes a $V_{BE}$ multiplier 38. The $V_{BE}$ multiplier 38 provides a technique for supplying a temperature-dependent current that, when converted to a voltage through resistors R5 and R6, produces a temperature-dependent level shift. This may contribute to a required amount of temperature compensation for the output buffer 10 if not fully realizable in the upstream temperature compensator 18.

The $V_{BE}$ multiplier 38 includes a resistor R10, a resistor R11, and a transistor Q11 having a base, collector and emitter. The collector of transistor Q11 is coupled to the voltage supply $V_{CC}$. The base of transistor Q11 is coupled to the collector of transistor Q11 via resistor R10. The base of transistor Q11 is also coupled to both the emitter of transistor Q11 and the base of transistor Q8 via resistor R11.

Figure 7:
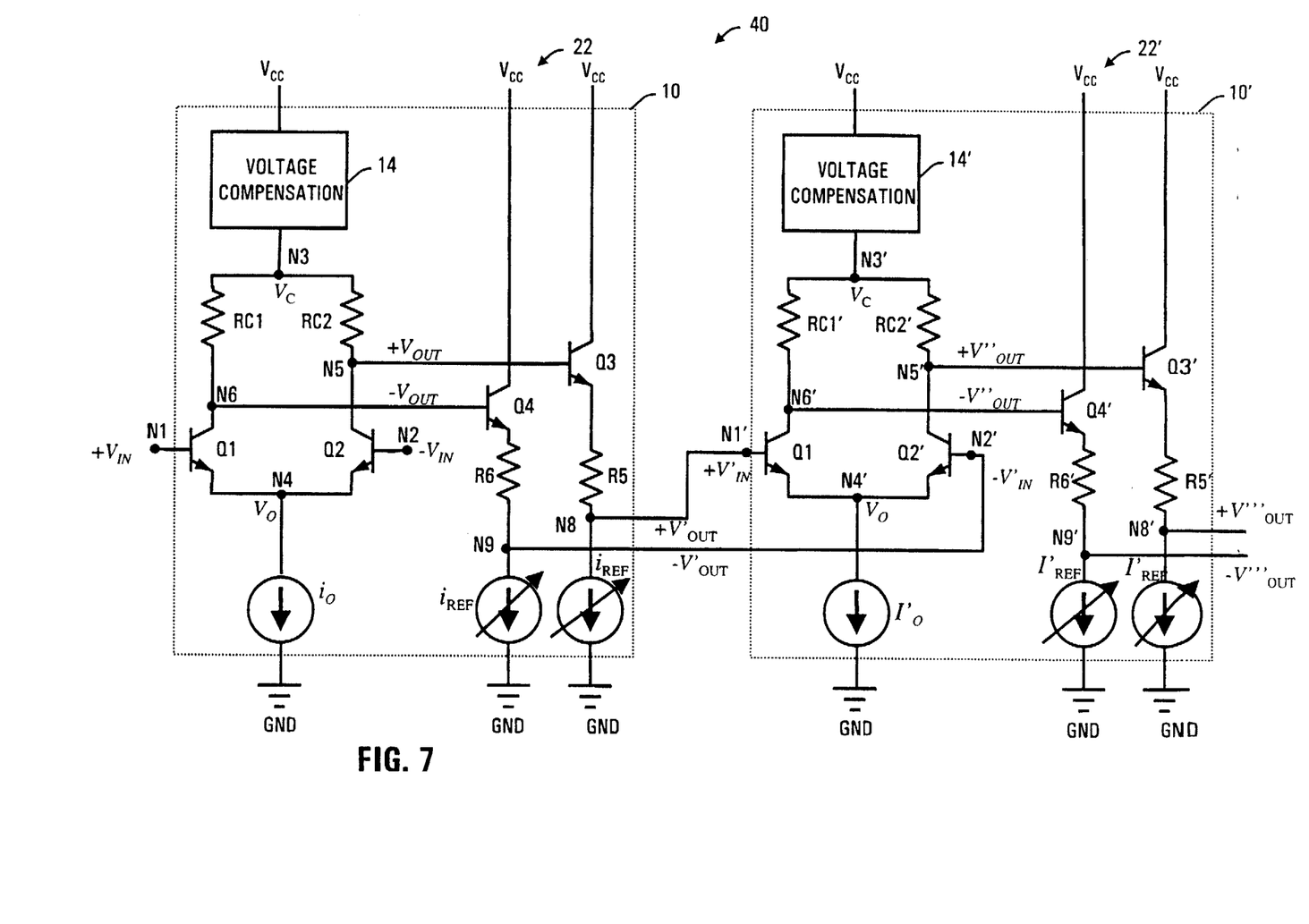
FIG. 7 a schematic diagram of a two-stage output buffer consistent with the invention.

Referring to FIG. 7, a multi-stage output buffer 40 consistent with the invention is illustrated with a cascaded first stage output buffer 10 and second stage output buffer 10'. Each stage 10, 10' contributes to the desired amount of level shifting and compensation to avoid the limits of transistor saturation. It should be appreciated that each state 10, 10' may include various combinations of compensating features described above with regard to FIGS. 1–6. More, each stage may differ from one another in order to prevent transistor saturation.

As an example of selecting the biasing currents and compensation for the output buffer 40 for an application, consider requirements as follows. The power supply $V_{CC}$ varies between 3.0–3.6 V. The operating temperature environment is 0–100° C. The differential swing of the input voltage signal is 0.3 V ($V_{IH}=V_{CC}-V_{BE}$; $V_{IL}=V_{CC}-V_{BE}-0.3$ V). A desired output voltage differential swing is 0.5 V with a common mode voltage of 1.25±0.10 V ($V_{OH}=1.5$ V; $V_{OL}=1.0$ V). In such an application, a cascading of two output buffers 10, 10' as shown in FIG. 7 allows achieving the required amount of compensation and level shifting.

It should be appreciated by those skilled in the art given the benefit of the instant disclosure that, within the limits of transistor saturation and proper operation of mirror transistors, a wide range of desired level shifts and output common-mode voltages (that is, a desired high output voltage level $V_{OH}$ and low output voltage level $V_{OL}$) may be achieved by appropriate selection of biasing currents, resistor values, and/or the number of stages 10, 10' in a multi-stage output buffer 40.

Figure 8A:
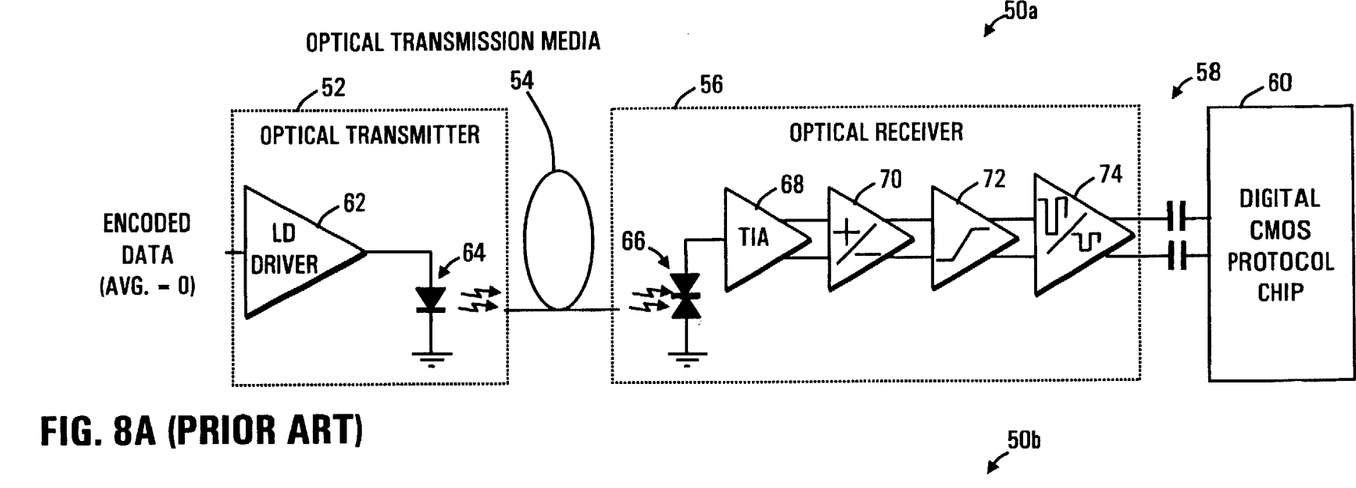
FIG. 8A is a schematic diagram of an illustrative communication system including a conventional differential output buffer.

Referring to FIG. 8A, an illustrative optical communication system 50a depicts a generally known limitation on performing high-speed communication with low voltage differential. The system 50a includes an optical transmitter 52 that transmits necessarily encoded data (i.e., average or common mode of 0) through an optical transmission media 54 to an optical receiver 56 for translating back to an electrical signal. The optical receiver 56 drives the electrical signal over a capacitive coupling 58 to a receiving device represented by a digital CMOS protocol chip 60. The chip 60 includes a load coupled across the first and second signal outputs for detecting the electrical signal.

More particularly, the optical transmitter 52 receives the encoded data as an electrical signal that is then amplified by a laser diode (LD) driver 62 and passed to a laser diode 64. The resulting optical signal transmits through the media 54 to the optical receiver 56 to be received by a photo diode 66. The encoded data electrical signal is reconstructed by a series of a Transimpedance Amplifier (TIA) 68, an amplifier 70, a limiter 72 and a generally-known output buffer 74 having a varying common mode. Consequently, the output common-mode voltage is ignored or eliminated during transmission to the receiving device, which is depicted as the protocol chip 60.

Figure 8B:
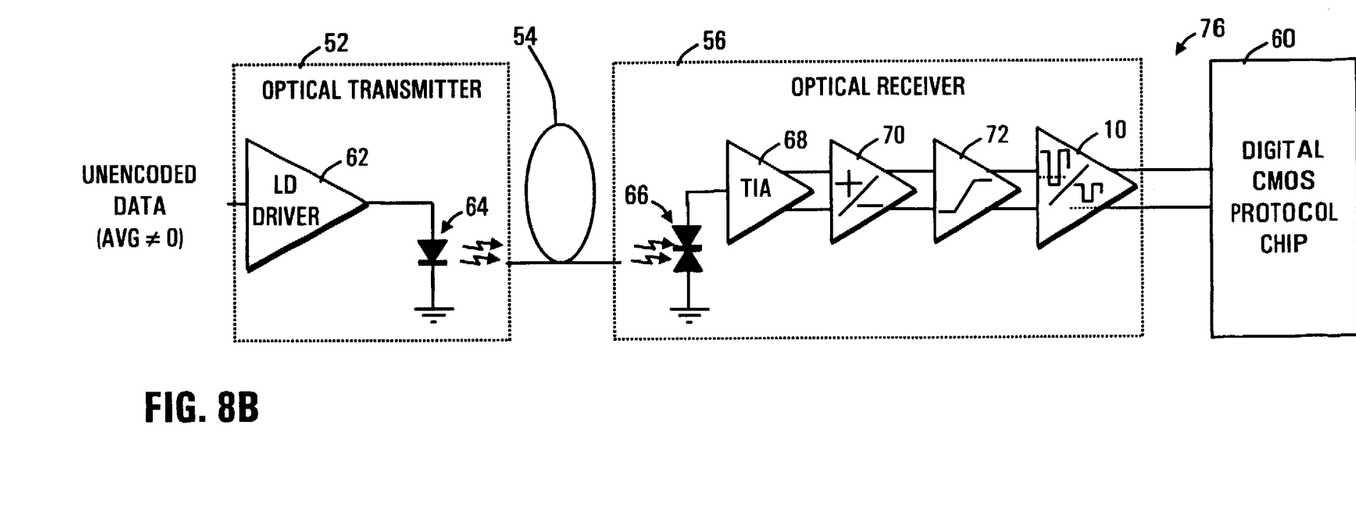
FIG. 8B is a schematic diagram of the illustrative communication system of FIG. 8A incorporating an output buffer consistent with the invention.

By contrast, with reference to FIG. 8B, an illustrative application of an output buffer 10 consistent with the invention in an optical communication system 50b allows use of unencoded data (i.e., average or common mode may not be zero). Consequently, a noncapacitive, DC coupling 76 is used between the optical receiver 56 and the receiving device 60. Consequently, the data carried in the output signal to the protocol chip 60 need not be encoded (average value of 0) increasing the applications appropriate for the output buffer 10.

Various modifications may be made to the illustrated embodiments without departing from the spirit and scope of the invention. For example, an output buffer 10 may have a predetermined amount of temperature dependence. For example, although temperature independence is achievable, specifying a temperature dependence may advantageously counter an opposite temperature dependence in another portion of the system 50b.

Other modifications will be apparent to one of ordinary skill in the art. Therefore, the invention lies in the claims hereinafter appended.

What is claimed is:

1. A circuit arrangement comprising:
    a differential amplifier including a first signal input, a second signal input, a first signal output, a second signal output, a first supply input, and a second supply input, the differential amplifier configured to amplify a differential signal provided at the first and second signal inputs; and a voltage compensator coupled to the first supply input, the voltage compensator comprising:
   a compensation transistor having a base, an emitter, and a collector, the collector coupled to the first supply input of the differential amplifier;
   a first compensation resistor coupled between a voltage source and the collector of the compensation transistor;
   a second compensation resistor coupled between the emitter of the compensation transistor and ground;
   a third compensation resistor coupled between the voltage source and the base of the compensation transistor; and
   a fourth compensation resistor coupled between the base of the compensation transistor and ground.

2. The circuit arrangement of claim 1, wherein the differential amplifier includes a first input transistor, a second input transistor, a first collector resistor and a second collector resistor; the first input transistor having a base, a collector and an emitter; the second input transistor having a base, a collector and an emitter; the first collector resistor coupled between the first supply input and the collector of the first input transistor, the second collector resistor coupled between the first supply input and the collector of the second input transistor, the base of the first input transistor coupled to the first signal input, the emitter of the first input transistor coupled to the second supply input; the base of the second input transistor coupled to the second signal input, the emitter of the second input transistor coupled to the second supply input; the collector of the first input transistor coupled to the first signal output, and the collector of the second input transistor coupled to the second signal output.

3. The circuit arrangement of claim 2, further comprising a first current source coupled between the second supply input and ground, wherein the first current source comprises a current mirror having a predetermined current operable to bias the first and second input transistors of the differential amplifier in their active regions.

4. The circuit arrangement of claim 1, wherein the voltage compensator further comprises a temperature compensator coupled to the base of the compensation transistor.

5. The circuit arrangement of claim 4, wherein the temperature compensator comprises a current mirror and a reference current circuit arrangement, the reference current circuit arrangement comprising a first current source having a positive temperature coefficient and a second current source having a negative temperature coefficient, the current mirror operable to replicate a temperature compensating current of the reference current circuit arrangement at the base of the compensation transistor of the voltage compensator.

6. The circuit arrangement of claim 1, further comprising a first emitter follower circuit arrangement, a second emitter follower circuit arrangement, a third output voltage, a fourth output voltage, and a second current source; the first emitter follower circuit arrangement including a first output transistor having a base, a collector, and an emitter; the second emitter follower circuit arrangement including a second output transistor having a base, a collector and an emitter; the base of the first output transistor coupled to the first signal output of the differential amplifier, the base of the second output transistor coupled to the second signal output of the differential amplifier; the collector of the first output transistor coupled to the voltage supply, the collector of the second output transistor coupled to the voltage supply; the emitter of the first output transistor coupled to the third output voltage, the emitter of the second output transistor coupled to the fourth output voltage, the second current source coupled between the third output voltage and ground, the second current source coupled between the fourth output voltage and ground, the second current source configured to respectively bias the emitters of the first and second output transistors with a reference current.

7. The circuit arrangement of claim 6, wherein the first emitter follower circuit arrangement includes a first level-shifting resistor, the first level-shifting resistor coupled between the emitter of the first output transistor and the third output voltage, and wherein the second emitter follower circuit arrangement includes a second level-shifting resistor, the second level-shifting resistor coupled between the emitter of the second output transistor and the fourth output voltage.

8. The circuit arrangement of claim 6, wherein the second current source comprises a VBE multiplier for generating the reference current and a two output current mirror for replicating the reference current at the respective emitters of the first and second output transistors.

9. The circuit arrangement of claim 8, wherein the VBE multiplier comprises a first biasing transistor, a first biasing resistor, and a second biasing resistor; the first biasing transistor having a base, a collector, and an emitter; the collector of the first biasing transistor coupled to the voltage source, the first biasing resistor coupled between the voltage source and the base of the first biasing transistor; the second biasing resistor coupled between the emitter and the base of the first biasing transistor; and wherein the two output current mirror comprises a second biasing transistor, a third biasing transistor, a fourth biasing transistor, a third biasing resistor, a fourth biasing resistor, and a fifth biasing resistor; the second, third, and four biasing transistors each having respectively a base, an emitter, and a collector; the collector of the second biasing transistor coupled to the emitter of the first biasing transistor and to the base of the second biasing transistor; the third biasing resistor coupled between the emitter of the second biasing transistor and ground; the collector of the third biasing transistor coupled to the third output voltage of the first emitter follower circuit arrangement, the base of the third biasing transfer coupled to the base of the second biasing transistor, the fourth biasing resistor coupled between the emitter of the third biasing transistor and ground; the collector of the fourth biasing transistor coupled to the fourth output voltage of the second emitter follower circuit arrangement, the base of the fourth biasing transistor coupled to the base of the second biasing transistor; the fifth biasing resistor coupled between the emitter of the fourth biasing transistor and ground.

10. The circuit arrangement of claim 1, further comprising a second stage including a second differential amplifier and a second voltage compensator, the second differential amplifier biased by the second voltage compensator; the first differential amplifier and first voltage compensator forming a first stage, the first and second signal inputs of the second stage coupled respectively to the first and second signal outputs of the first stage.

11. A method of compensating an output buffer for variations in supply voltage and temperature, the output buffer including a differential amplifier and an output section; the differential amplifier including a first signal input, a second signal input, a first signal output, a second signal output, a first supply input, and a second supply input; the differential amplifier configured to amplify a differential signal provided at the first and second signal inputs; the output section including a first emitter follower and a second emitter follower each configured to level shift respectively output voltages at the first and second signal outputs of the differential amplifier; the method comprising:

varying a compensating voltage at the first supply input of the differential amplifier, the variation in compensated voltage mitigating variations in a supply voltage;

current biasing the second supply input with a predetermined operating current selected to maintain the differential amplifier in unsaturated operation; and current biasing the output section with a predetermined reference current selected to maintain the output section in unsaturated operation.

12. The method of claim 11, wherein varying the compensating voltage further includes temperature biasing the compensating voltage.

13. A method of compensating an output buffer for variations in supply voltage and temperature, the output buffer including a differential amplifier and an output section; the differential amplifier including a first signal input, a second signal input, a first signal output, a second signal output, a first supply input, and a second supply input; the differential amplifier configured to amplify a differential signal provided at the first and second signal inputs; the output section including a first emitter follower and a second emitter follower each configured to level shift respectively output voltages at the first and second signal outputs of the differential amplifier; the method comprising:

varying a compensating voltage at the first supply input of the differential amplifier, the variation in compensated voltage mitigating variations in a supply voltage;

current biasing the second supply input with a predetermined operating current selected to maintain the differential amplifier in unsaturated operation; and current biasing the output section with a predetermined reference current selected to maintain the output section in unsaturated operation, wherein current biasing the output section further includes varying the current biasing for temperature compensation with a $V_{BE}$ multiplier.

14. The method of claim 11, further comprising level shifting an output signal by inserting a predetermined emitter coupled resistance to at least one of the two emitter followers of the output section.

* * * * *